US011876010B2

(12) United States Patent
Okazaki et al.

(10) Patent No.: US 11,876,010 B2
(45) Date of Patent: Jan. 16, 2024

(54) SUBSTRATE PROCESSING APPARATUS AND RECORDING MEDIUM

(71) Applicant: KOKUSAI ELECTRIC CORPORATION, Tokyo (JP)

(72) Inventors: Tadashi Okazaki, Toyama (JP); Hajime Abiko, Toyama (JP); Tomoyuki Miyada, Toyama (JP); Yukinao Kaga, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 601 days.

(21) Appl. No.: 16/821,563

(22) Filed: Mar. 17, 2020

(65) Prior Publication Data
US 2020/0219745 A1 Jul. 9, 2020

Related U.S. Application Data

(63) Continuation of application No. PCT/JP2017/035004, filed on Sep. 27, 2017.

(51) Int. Cl.
*H01L 21/677* (2006.01)
*H01L 21/67* (2006.01)
(Continued)

(52) U.S. Cl.
CPC ...... *H01L 21/67742* (2013.01); *G05B 19/418* (2013.01); *H01L 21/02005* (2013.01);
(Continued)

(58) Field of Classification Search
None
See application file for complete search history.

(56) References Cited

U.S. PATENT DOCUMENTS 4,938,655 A * 7/1990 Asano ............... H01L 21/67781
414/416.11
5,112,641 A * 5/1992 Harada ............. H01L 21/67781
414/941
(Continued)

FOREIGN PATENT DOCUMENTS

CN 1565050 A 1/2005
CN 104934317 A * 9/2015 ....... H01L 21/02164
(Continued)

OTHER PUBLICATIONS

Machine Translation of Japanese Patent Application JP 2018056230 A, 2018. (Year: 2018).*
(Continued)

*Primary Examiner* — Steven G Snyder
(74) *Attorney, Agent, or Firm* — Volpe Koenig

(57) ABSTRACT

There is provided a configuration that includes a substrate holder configured to hold substrates; a transfer mechanism configured to transfer the substrates to the substrate holder; and a controller configured to: acquire a number of substrates mountable on the substrate holder and a number of the product substrates to be mounted on the substrate holder; divide the product substrates into product substrate groups; divide the dummy substrates into dummy substrate groups based on the number of the product substrates, the number of the substrates mountable on the substrate holder, and a number of the product substrate groups; combine the product substrate groups and the dummy substrate groups; create substrate arrangement data for distributing and mounting the product substrates on the substrate holder; and cause the transfer mechanism to transfer the substrates according to the substrate arrangement data.

9 Claims, 14 Drawing Sheets

(51) Int. Cl.
*G05B 19/418* (2006.01)
*H01L 21/02* (2006.01)

(52) U.S. Cl.
CPC .. *H01L 21/67276* (2013.01); *H01L 21/67754* (2013.01); *H01L 21/67757* (2013.01); *H01L 21/67781* (2013.01)

(56) References Cited

U.S. PATENT DOCUMENTS

| | | | | |
|---|---|---|---|---|
| 5,217,340 A | * | 6/1993 | Harada | H01L 21/67781 414/331.14 |
| 5,942,012 A | * | 8/1999 | Kumasaka | H01L 21/67778 29/25.01 |
| 6,306,764 B1 | * | 10/2001 | Kato | H01L 21/67109 438/758 |
| 6,975,917 B2 | * | 12/2005 | Sakamoto | H01L 21/67253 219/390 |
| 9,228,260 B1 | * | 1/2016 | Hsiao | H01L 21/67109 |
| 10,373,818 B1 | * | 8/2019 | Cheng | C23C 16/00 |
| 10,600,677 B2 | * | 3/2020 | Ishizuka | H01L 21/76254 |
| 11,121,014 B2 | * | 9/2021 | de Ridder | H01L 21/67772 |
| 2002/0037645 A1 | * | 3/2002 | Matsunaga | C23C 16/54 438/778 |
| 2004/0238519 A1 | * | 12/2004 | Sakamoto | F27D 19/00 219/390 |
| 2006/0029735 A1 | * | 2/2006 | Ko | H01L 21/31662 427/248.1 |
| 2006/0156982 A1 | * | 7/2006 | Kim | H01L 21/67109 438/758 |
| 2010/0003831 A1 | * | 1/2010 | Yasuda | C23C 16/52 438/758 |
| 2019/0198386 A1 | * | 6/2019 | Ishizuka | H01L 21/02002 |
| 2019/0237321 A1 | * | 8/2019 | Cheng | H01L 21/31111 |
| 2019/0371639 A1 | * | 12/2019 | de Ridder | H01L 21/67373 |
| 2022/0068687 A1 | * | 3/2022 | Shirako | H01L 21/67167 |

FOREIGN PATENT DOCUMENTS

| | | | | |
|---|---|---|---|---|
| CN | 110277305 A | * | 9/2019 | C23C 16/4412 |
| EP | 0381338 A2 | * | 8/1990 | |
| JP | 10-125761 A | | 5/1998 | |
| JP | 10-256341 A | | 9/1998 | |
| KR | 100532584 B1 | * | 12/2005 | |
| KR | 20220046480 A | * | 4/2022 | |

OTHER PUBLICATIONS

International Search Report, PCT/JP2017/035004, dated Jan. 9, 2018, 1 pg.
Chinese Office Action dated Mar. 28, 2023 for Chinese Patent Application No. 201780094084.1.

* cited by examiner

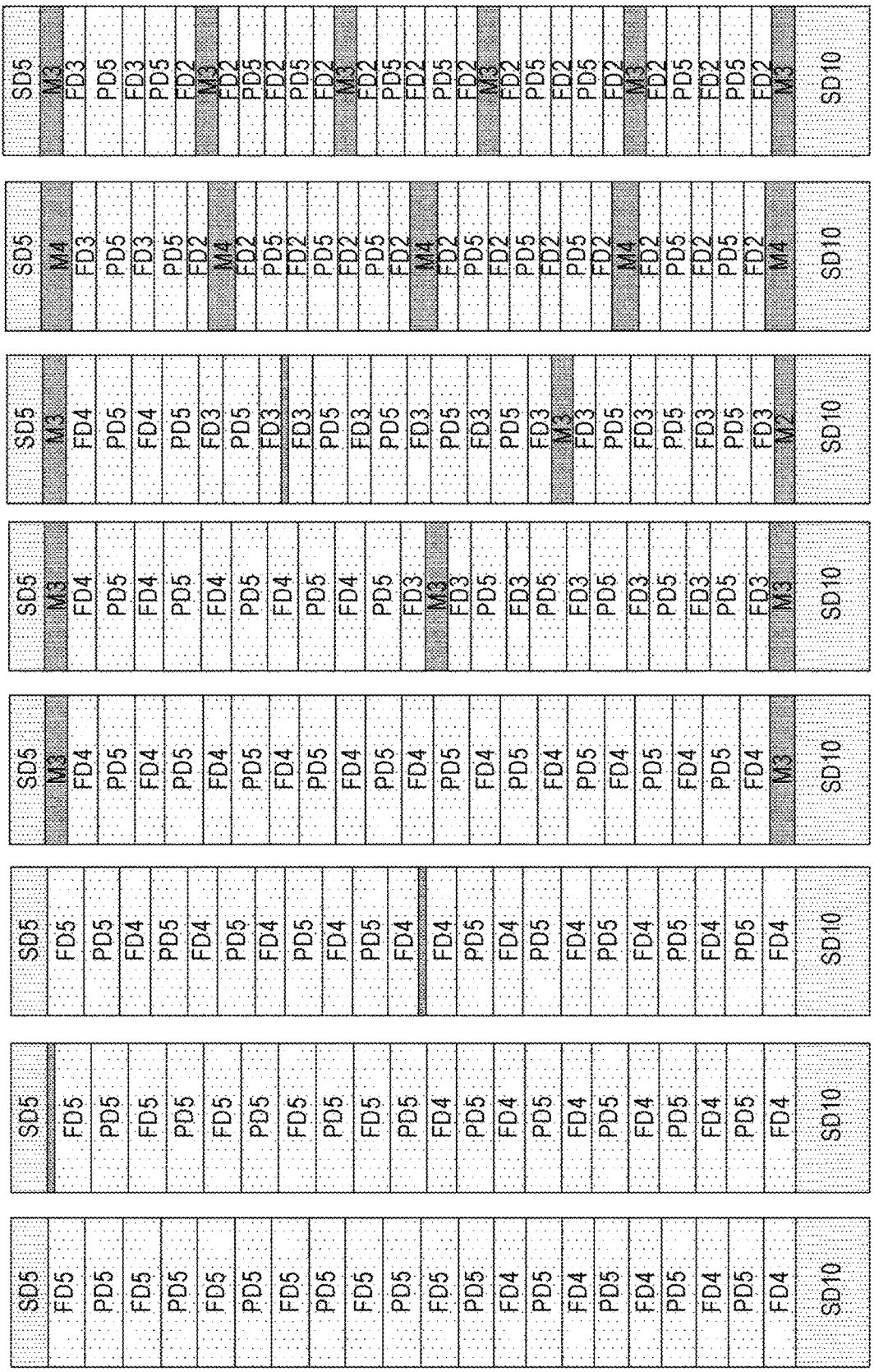

FIG. 9B

| Transfer region | Number | Number | Number | Number | Number | Number | Number | Number |
|---|---|---|---|---|---|---|---|---|
| Upper | 0 | 1 | 0 | 3 | 3 | 3 | 4 | 3 |
| Middle(1) | 0 | 0 | 1 | 3 | 0 | 1 | 4 | 3 |
| Middle(2) | 0 | 0 | 0 | 0 | 0 | 3 | 4 | 3 |
| Middle(3) | 0 | 0 | 0 | 0 | 0 | 0 | 0 | 3 |
| Middle(4) | 0 | 0 | 0 | 3 | 3 | 2 | 4 | 3 |
| Lower | 0 | 0 | 0 | 3 | 3 | 3 | 4 | 3 |

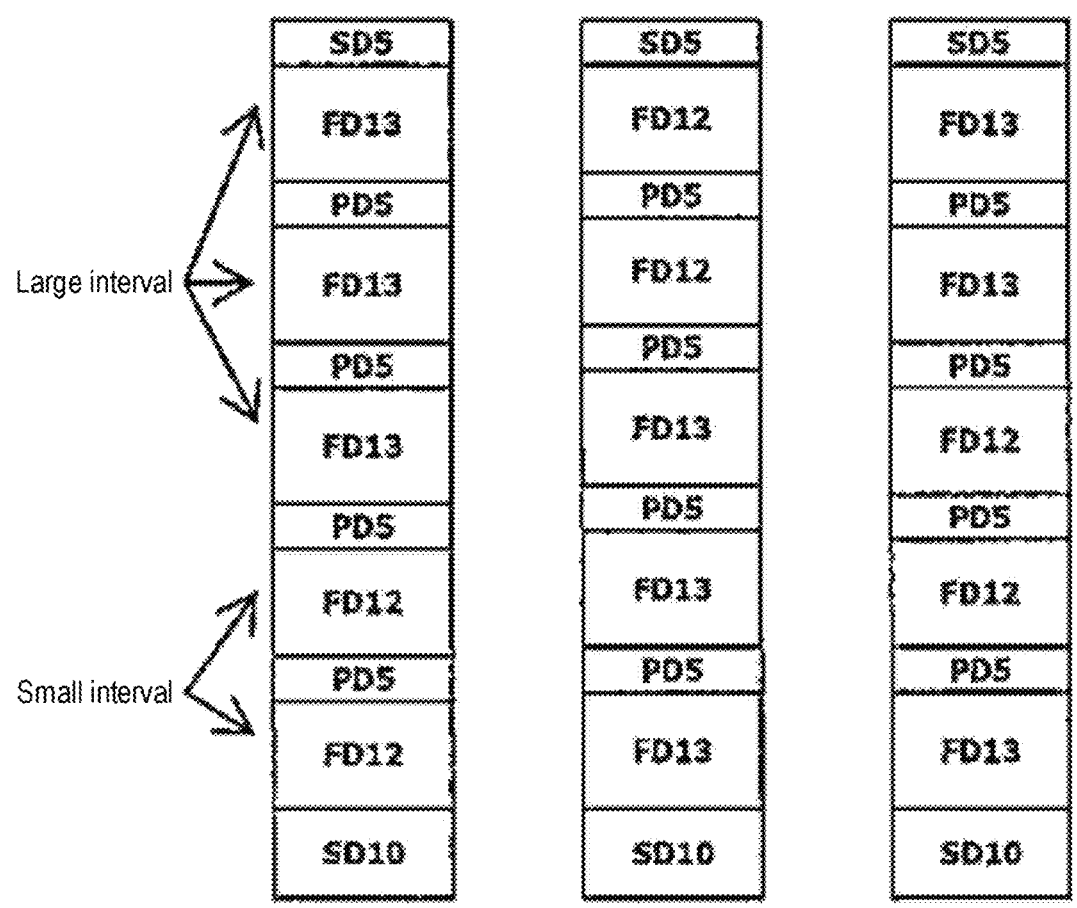

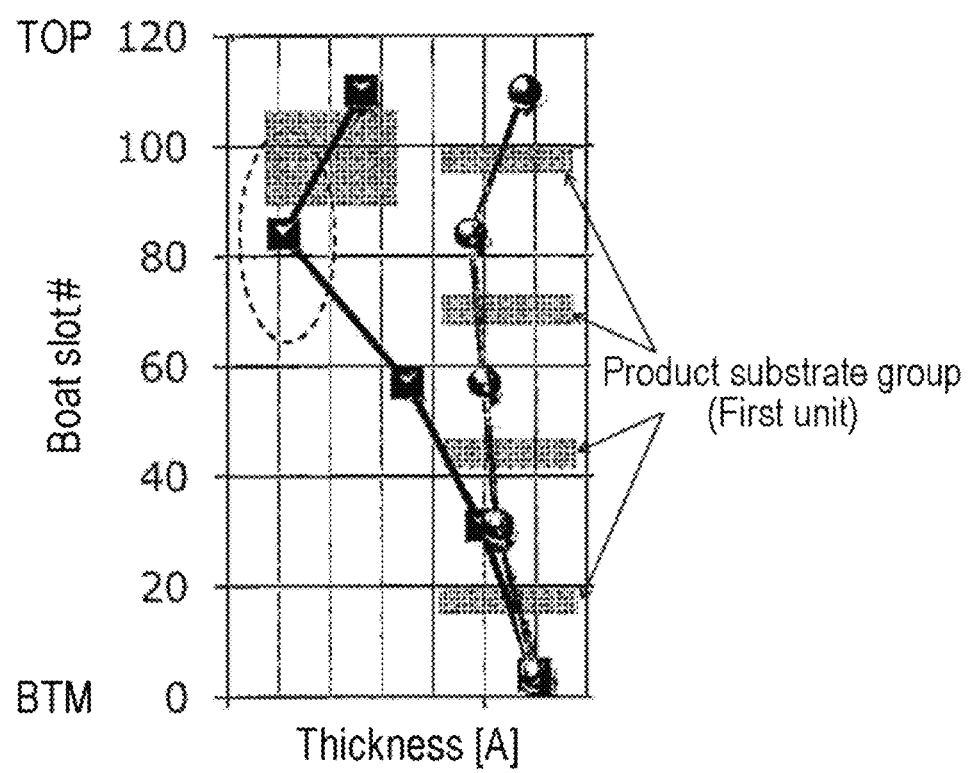

SUBSTRATE PROCESSING APPARATUS AND RECORDING MEDIUM

CROSS-REFERENCE TO RELATED APPLICATION

This application is a Bypass Continuation Application of PCT International Application No. PCT/JP2017/035004, filed on Sep. 27, 2017, the entire content of which is incorporated herein by reference.

TECHNICAL FIELD

The present disclosure relates to an apparatus and a recording medium for processing a substrate.

BACKGROUND

In a semiconductor manufacturing apparatus, which is one type of substrate processing apparatus, a boat as a substrate holder charged with wafers as substrates is loaded into a furnace heated to a predetermined temperature by a heater as heating means. Then an inside of the furnace is vacuum-exhausted, a reaction gas is introduced from a reaction gas introduction pipe to perform processing on a wafer surface, and an exhaust gas is discharged through an exhaust pipe. Furthermore, the boat includes a plurality of columns and holds a plurality of wafers horizontally with grooves (hereinafter, also referred to as slots) formed in the columns.

In recent years, a processing for a small lot (20 to 100 product substrates, for example, 25 or 50 product substrates) has become mainstream. In the case of a small lot, as known in the related art, if a number of product substrates is smaller than a number of slots as substrate mounting portions when arranging the product substrates on a boat, the product substrates are transferred to a part of the boat. Furthermore, as known in the related art, the product substrates are transferred to the boat on a carrier-by-carrier basis. However, in such cases, there occurs an event that a gas consumption in the furnace becomes non-uniform and the film formation difference between the substrates becomes larger.

Furthermore, as a method of distributing and arranging product substrates on a boat, there is available a method of transferring the product substrates every several slots. However, since the product substrates are transferred one by one, a transfer time becomes longer.

SUMMARY

Some embodiments of the present disclosure provide a configuration capable of appropriately arranging product substrates on a boat in a small-lot production of product substrates.

According to one or more embodiments of the present disclosure, there is provided a configuration that includes a substrate holder configured to hold a plurality of types of substrates including product substrates and dummy substrates; a transfer mechanism configured to transfer the plurality of types of substrates to the substrate holder; and a controller configured to: acquire a number of substrates mountable on the substrate holder and a number of the product substrates to be mounted on the substrate holder; divide the product substrates into a plurality of product substrate groups based on the acquired number of the product substrates; divide the dummy substrates into a plurality of dummy substrate groups based on the acquired number of the product substrates, the acquired number of the substrates mountable on the substrate holder, and a number of the product substrate groups; combine the product substrate groups and the dummy substrate groups; create substrate arrangement data for distributing and mounting the product substrates on a plurality of regions of the substrate holder; and cause the transfer mechanism to transfer the plurality of types of substrates to the substrate holder according to the created substrate arrangement data.

BRIEF DESCRIPTION OF DRAWINGS

FIGS. 9A and 9B are views for explaining a transfer pattern of a monitor wafer according to the embodiments of the present disclosure.

FIG. 12 is a view showing other embodiment examples of the substrate arrangement program according to the embodiments of the present disclosure.

FIG. 13 is a view showing an effect obtained in the substrate processing sequence according to the embodiments of the present disclosure.

DETAILED DESCRIPTION

Figure 1:
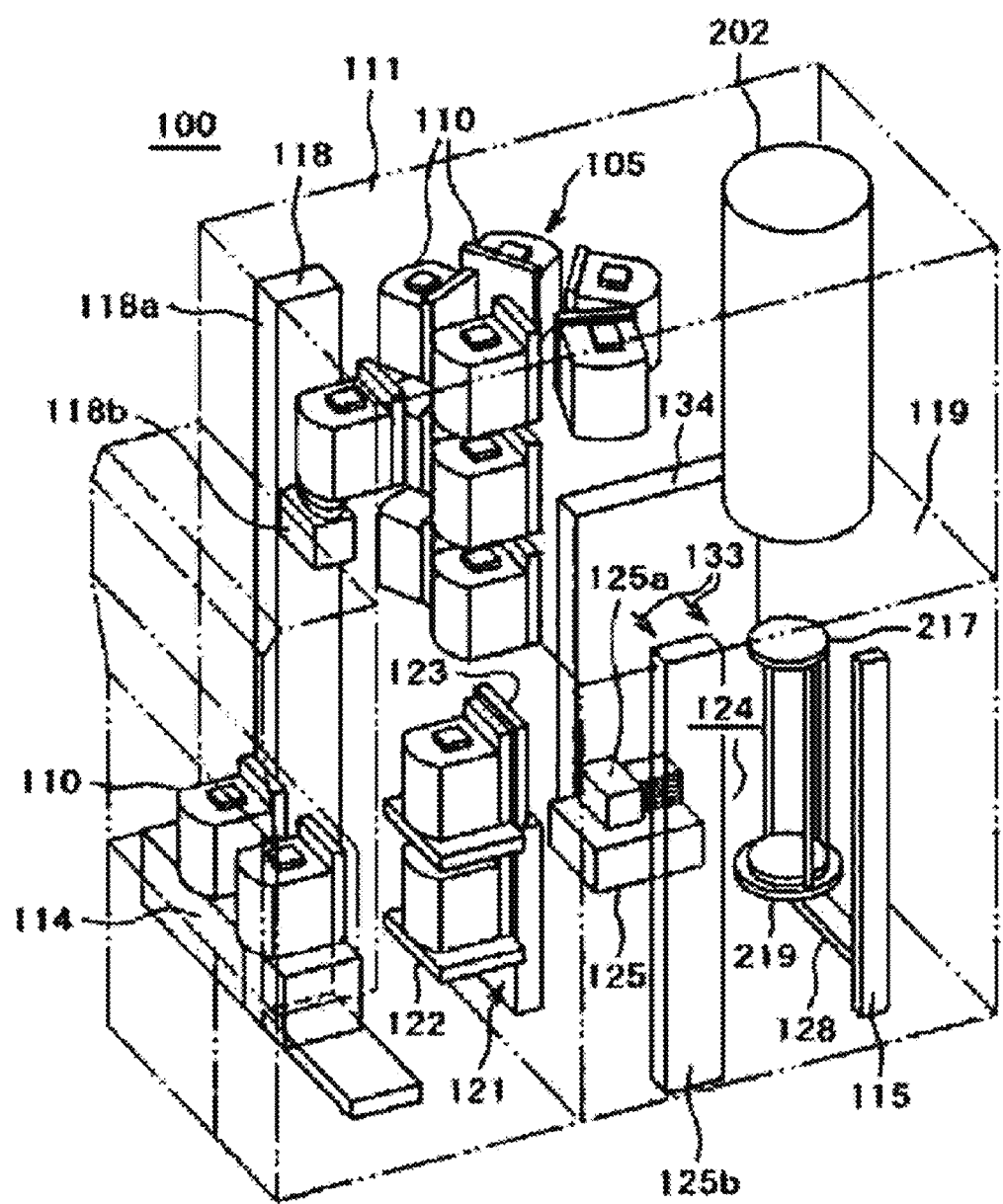
FIG. 1 is a perspective view of a substrate processing apparatus according to one or more embodiments of the present disclosure.

Hereinafter, a substrate processing apparatus according to one or more embodiments of the present disclosure will be described with reference to the drawings. Further, in the following description, the same components are denoted by the same reference numerals, and the repeated description thereof may be omitted. In addition, in order to make the description clearer, widths, thicknesses, shapes and the like of each part may be schematically illustrated as compared with actual ones. However, this is merely an example and is not intended to limit the interpretation of the present disclosure.

In the present embodiments, as examples, the substrate processing apparatus is configured as a semiconductor manufacturing apparatus that performs a processing procedure in a method of manufacturing a semiconductor device (for example, an IC: Integrated Circuit).

Figure 2:
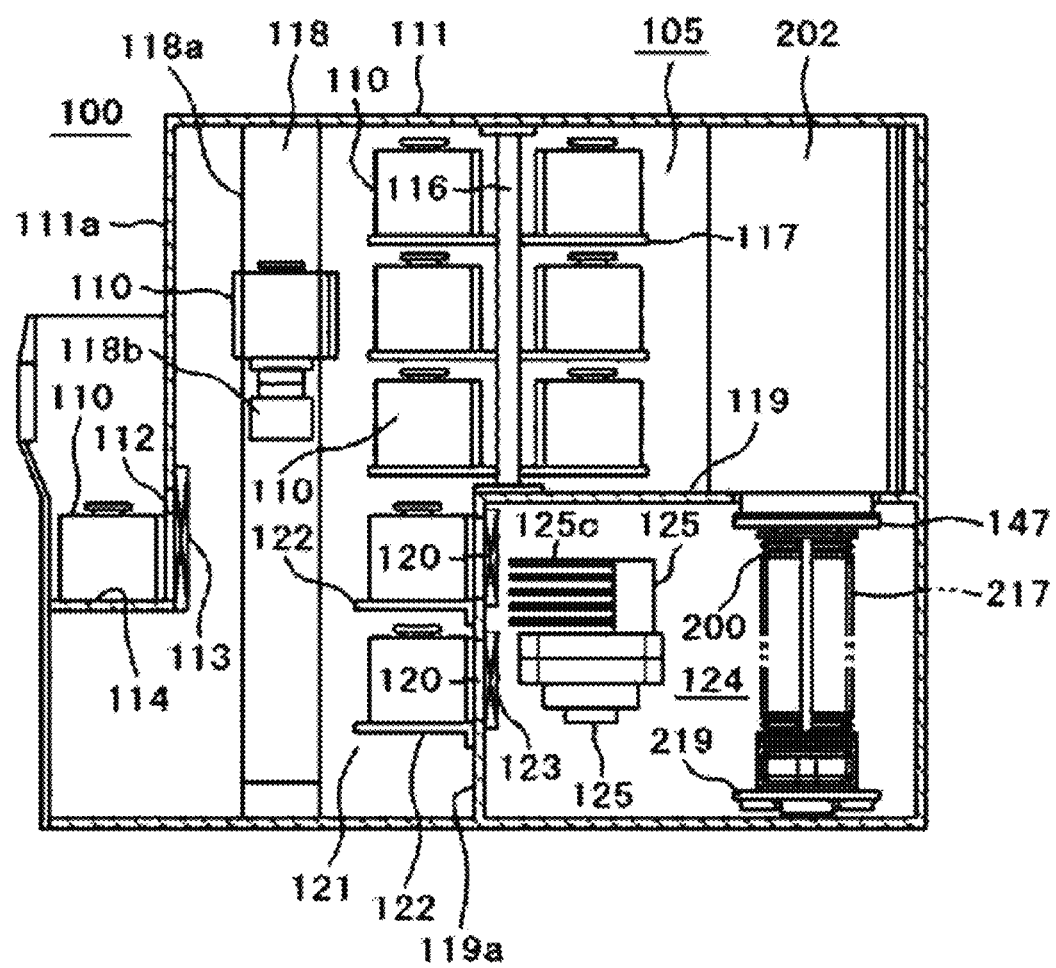
FIG. 2 is a side perspective view of the substrate processing apparatus according to the embodiments of the present disclosure.

As shown in FIGS. 1 and 2, a substrate processing apparatus 100 according to the present embodiments uses a pod 110 as a carrier for accommodating wafers (substrates) 200 made of silicon or the like, and includes a housing 111. A pod loading/unloading port 112 is formed on a front wall 111a of the housing 111 to bring an inside and an outside of the housing 111 into communication with each other. The pod loading/unloading port 112 is opened or closed by a front shutter 113. A load port 114 is provided at a front side of the pod loading/unloading port 112. The pod 110 is mounted on the load port 114. The pod 110 is loaded onto the load port 114 and unloaded from the load port 114 by an in-process transfer device (not shown).

A rotating shelf 105 is installed inside the housing 111 at an upper portion in a substantially central region in a front-rear direction of the housing 111. The rotating shelf 105 rotates around a column 116 and stores a plurality of pods 110 on shelf plates 117. As shown in FIG. 2, a pod transfer device 118 is installed between the load port 114 and the rotating shelf 105 in the housing 111. The pod transfer device 118 includes a pod elevator 118a that can move up or down while holding the pod 110, and a pod transfer mechanism 118b as a horizontal transfer mechanism. The pod transfer device 118 transfers the pod 110 between the load port 114, the rotating shelf 105, and a pod opener 121.

As shown in FIG. 2, a sub-housing 119 is provided inside the housing 111 at a lower portion in the substantially central region in the front-rear direction over a rear end of the housing 111. A pair of wafer loading/unloading ports 120 for loading or unloading the wafers 200 into and from the sub-housing 119 is installed at a front wall 119a of the sub-housing 119 in a manner such that the wafer loading/unloading ports 120 are vertically arranged in two stages. A pair of pod openers 121 is installed at the upper and lower stages of the wafer loading/unloading ports 120, respectively.

The pod opener 121 includes a mounting table 122 on which the pod 110 is mounted, and a cap (lid) attaching/detaching mechanism 123 for attaching or detaching a cap of the pod 110. The pod opener 121 opens or closes a wafer entrance of the pod 110 by attaching or detaching the cap of the pod 110 mounted on the mounting table 122 by using the cap attaching/detaching mechanism 123. The mounting table 122 is a transfer shelf on which a substrate container is mounted when transferring a substrate.

As shown in FIG. 2, the sub-housing 119 includes a transfer chamber 124 isolated from an atmosphere in a space where the pod transfer device 118 and the rotating shelf 105 are installed. A wafer transfer mechanism 125 is installed in a front area of the transfer chamber 124.

The wafer transfer mechanism 125 includes a wafer transfer device 125a which can horizontally rotate or linearly move the wafers 200 by holding the wafers 200 on tweezers 125c, and a wafer transfer device elevator 125b for raising or lowering the wafer transfer device 125a. By consecutive operation of the wafer transfer device 125a and the wafer transfer device elevator 125b, the wafers 200 are loaded or unloaded with respect to the boat 217. As shown in the figure, a number of tweezers 125c in the present embodiments is five, and the wafer transfer mechanism 125 is configured to be able to transfer five wafers 200 at a time or one by one.

As shown in FIG. 2, a process furnace 202 is installed above the boat 217. The process furnace 202 includes a process chamber (not shown) formed inside the process furnace 202. A heater (not shown) for heating the inside of the process chamber is provided around the process chamber. A lower end of the process furnace 202 is opened or closed by a furnace port gate valve 147.

As shown in FIG. 1, a boat elevator 115 for raising or lowering the boat 217 is installed. A seal cap 219 is horizontally mounted on an arm 128 connected to the boat elevator 115. The seal cap 219 is configured to vertically support the boat 217 and is capable of closing the lower end of the process furnace 202.

Next, the operations of the substrate processing apparatus of the present embodiments will be described. As shown in FIGS. 1 and 2, when the pod 110 is supplied to the load port 114, the pod loading/unloading port 112 is opened by the front shutter 113, and the pod 110 is loaded from the pod loading/unloading port 112. The pod 110 thus loaded is automatically transferred and delivered to a designated shelf plate 117 of the rotating shelf 105 by the pod transfer device 118.

After the pod 110 is temporarily stored on the rotating shelf 105, the pod 110 may be transferred from the shelf plate 117 to one of the pod openers 121 and delivered to the mounting table 122, or may be directly transferred from the load port 114 to the pod opener 121 and delivered to the mounting table 122. In this operation, the wafer loading/unloading port 120 of the pod opener 121 is closed by the cap attaching/detaching mechanism 123, and the transfer chamber 124 is filled with clean air 133 flowing through the transfer chamber 124.

As shown in FIG. 2, the cap of the pod 110 mounted on the mounting table 122 is removed by the cap attaching/detaching mechanism 123, whereby the wafer entrance of the pod 110 is opened. The wafers 200 are picked up from the pod 110 by the wafer transfer mechanism 125, transferred to the boat 217, and loaded into the boat 217. The wafer transfer mechanism 125 that has delivered the wafers 200 to the boat 217 returns to the pod 110 and loads the next wafers 200 into the boat 217.

While the wafer transfer device 125a loads the wafers 200 into the boat 217 with one (upper or lower) of the pod openers 121, another pod 110 is transferred from the rotating shelf 105 or the load port 114 to the other one (lower or upper) of the pod openers 121 by the pod transfer device 118 and thus the operation of opening the pod 110 by the pod opener 121 can be performed simultaneously.

When a predetermined number of wafers 200 are loaded into the boat 217, the lower end of the process furnace 202 is opened by the furnace port gate valve 147. Subsequently, the seal cap 219 is raised by the boat elevator 115, and the boat 217 supported by the seal cap 219 is loaded into the process chamber of the process furnace 202. After the loading, proper processing is performed on the wafers 200 in the process chamber. After the processing, the boat 217 is pulled out by the boat elevator 115. Thereafter, the wafers 200 and the pod 110 are discharged to the outside of the housing 111 in the reverse order of the above-described operations.

<Configuration of Process Furnace>

Figure 3:
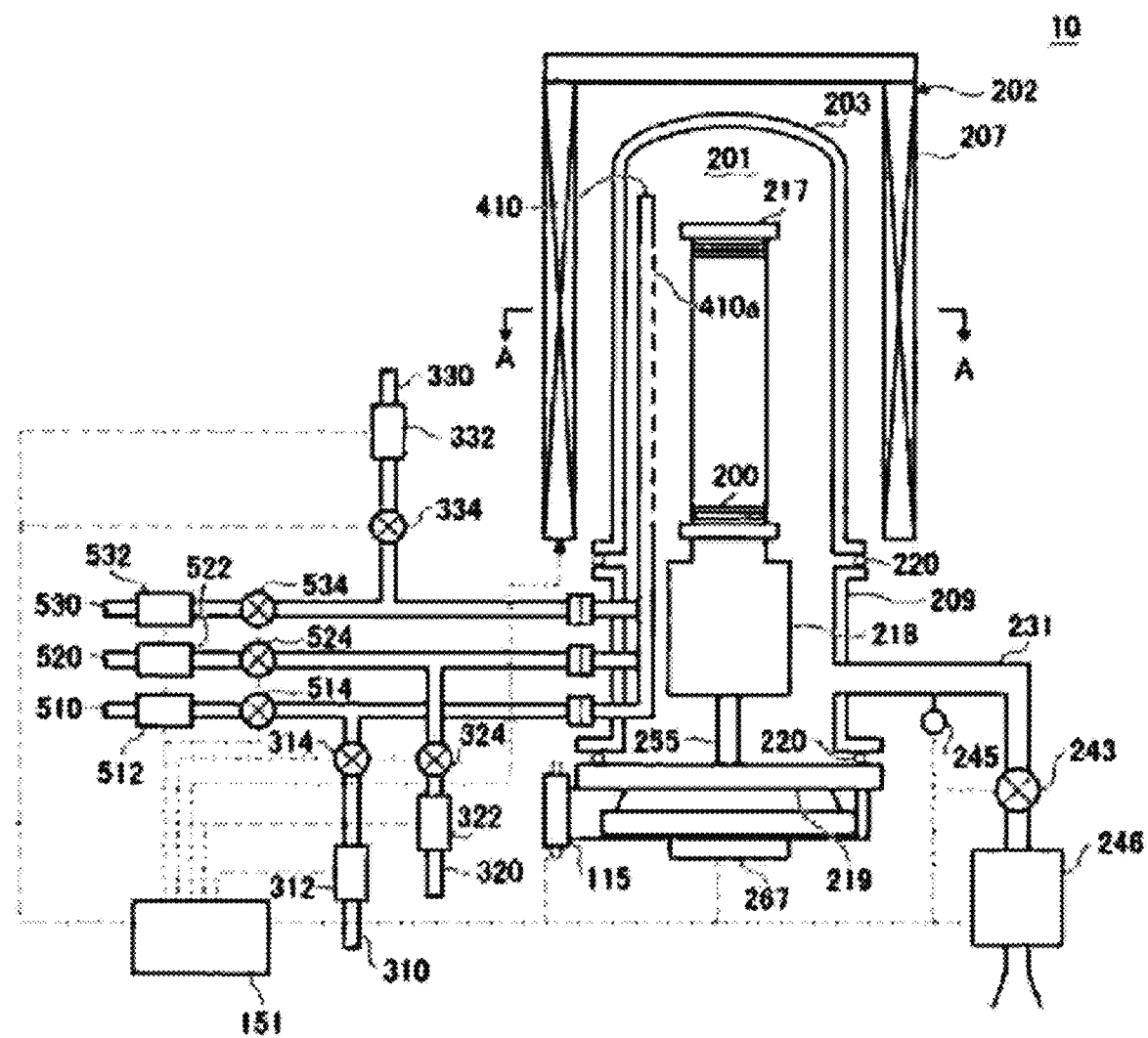
FIG. 3 is a plane view of a process furnace of the substrate processing apparatus according to the embodiments of the present disclosure.
Figure 4:
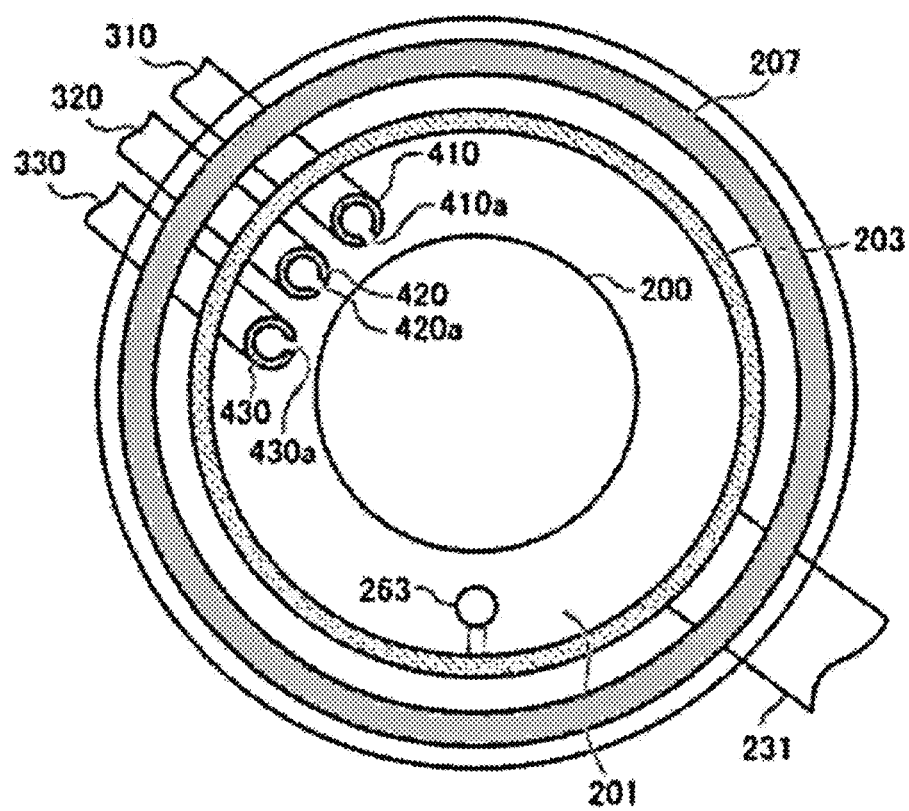
FIG. 4 is a vertical sectional view taken along line A-A in FIG. 1.

As shown in FIGS. 3 and 4, the process furnace 202 includes a heater 207 as a heating mechanism for heating the wafers (substrates) 200. Inside the heater 207, a reaction tube 203 which constitutes a reaction container (process container) is installed concentrically with the heater 207. The reaction tube 203 is made of a heat-resistant material such as quartz ($SiO_2$) or the like, and is formed in a cylindrical shape with its upper end closed and its lower end opened.

A manifold 209 made of, for example, stainless steel is attached to a lower end of the reaction tube 203. The manifold 209 is formed in a cylindrical shape, and its lower end opening is hermetically closed by a seal cap 219 serving as a lid. O-rings 220 are installed between the reaction tube 203, the manifold 209, and the seal cap 219, respectively. A process chamber 201 is defined by the reaction tube 203, the manifold 209, and the seal cap 219. A boat 217 as a substrate holder is vertically installed on the seal cap 219 via a boat support 218.

A plurality of wafers 200 to be batch-processed is arranged in a horizontal posture on the boat 217 in multiple stages in a vertical direction. The boat 217 can be moved up or down with respect to the reaction tube 203 by the boat elevator 115. At a lower end of the boat support 218, a boat rotation mechanism 267 for rotating the boat 217 is installed to improve the uniformity of processing. The heater 207 heats the wafers 200 loaded into the process chamber 201 to a predetermined temperature.

In the process chamber 201, a nozzle 410 (first nozzle 410), a nozzle 420 (second nozzle 420), and a nozzle 430 (third nozzle 430) are installed to pass through a lower portion of the reaction tube 203. A gas supply pipe 310 (first gas supply pipe 310), a gas supply pipe 320 (second gas supply pipe 320), and a gas supply pipe 330 (third gas supply pipe 330) are connected to the nozzle 410, the nozzle 420, and the nozzle 430, respectively. As described above, the reaction tube 203 includes the three nozzles 410, 420, and 430, and the three gas supply pipes 310, 320, and 330 so that a plurality of types, e.g., three types of gases (process gases) can be supplied into the process chamber 201.

A mass flow controller (abbreviation: MFC) 312 as a flow rate control device (flow rate control part) and a valve 314 as an opening/closing valve are installed in the gas supply pipe 310 sequentially from an upstream side. The nozzle 410 is connected to an end portion of the gas supply pipe 310. The nozzle 410 is configured as an L-shaped long nozzle, and its horizontal portion is installed to penetrate a side wall of the manifold 209. A vertical portion of the nozzle 410 is installed in an arc-shaped space formed between an inner wall of the reaction tube 203 and the wafers 200, so as to extend upward (in a stacking direction of the wafers 200) along the inner wall of the reaction tube 203 (i.e., so as to extend upward from one end to the other end of the wafer arrangement region). As such, the nozzle 410 is installed in a region horizontally surrounding the wafer arrangement region on a side of the wafer arrangement region where the wafers 200 are arranged, so as to extend along the wafer arrangement region.

Gas supply holes 410a for supplying gas are installed on a side surface of the nozzle 410. The gas supply holes 410a are opened to face a center of the reaction tube 203. The gas supply holes 410a are arranged from the lower portion to an upper portion of the reaction tube 203. The opening areas of the gas supply holes 410a may be the same or have gradation in size. Furthermore, the gas supply holes 410a may be formed at the same opening pitch. A first gas supply system includes the gas supply pipe 310, the MFC 312, the valve 314, and the nozzle 410.

Furthermore, a carrier gas supply pipe 510 for supplying a carrier gas is connected to the gas supply pipe 310. A first carrier gas supply system includes the carrier gas supply pipe 510, the MFC 512, and the valve 514.

An MFC 322 as a flow rate control device (flow rate control part) and a valve 324 as an opening/closing valve are installed in the gas supply pipe 320 sequentially from an upstream side. The nozzle 420 is connected to an end portion of the gas supply pipe 320. The nozzle 420 is configured as an L-shaped long nozzle similar to the nozzle 410. The configurations of the horizontal portion and the vertical portion of the nozzle 420 are similar to those of the nozzle 410.

Gas supply holes 420a for supplying gas are installed on a side surface of the nozzle 420. The configurations of the gas supply holes 420a are similar to those of the gas supply holes 410a. A second gas supply system includes the gas supply pipe 320, the MFC 322, the valve 324, and the nozzle 420.

Furthermore, a carrier gas supply pipe 520 for supplying a carrier gas is connected to the gas supply pipe 320. A second carrier gas supply system includes the carrier gas supply pipe 520, the MFC 522, and the valve 524.

An MFC 332 as a flow rate control device (flow rate control part) and a valve 334 as an opening/closing valve are installed in the gas supply pipe 330 sequentially from an upstream side. A nozzle 430 is connected to an end portion of the gas supply pipe 330. The nozzle 430 is configured as an L-shaped long nozzle similar to the nozzle 410. The configurations of the horizontal portion and the vertical portion of the nozzle 430 are similar to those of the nozzles 410 and 420.

Gas supply holes 430a for supplying a gas are installed on a side surface of the nozzle 430. The configurations of the gas supply holes 430a are similar to those of the gas supply holes 410a and 420a. A third gas supply system includes the gas supply pipe 330, the MFC 332, the valve 334, and the nozzle 430.

Furthermore, a carrier gas supply pipe 530 for supplying a carrier gas is connected to the gas supply pipe 330. A third carrier gas supply system includes the carrier gas supply pipe 530, the MFC 532, and the valve 534.

As described above, in the gas supply methods according to the present embodiments, the gases are supplied via the nozzles 410, 420, and 430 disposed in the arc-shaped vertically-extending space defined by the inner wall of the reaction tube 203 and the ends of the plurality of stacked wafers 200. The gases are first ejected into the reaction tube 203 to a vicinity of the wafers 200 from the gas supply holes 410a, 420a, and 430a respectively formed in the nozzles 410, 420, and 430. Main flow of the gases in the reaction tube 203 is formed in the direction parallel to the surface of the wafer 200, i.e., in the horizontal direction. With this configuration, there is an effect that the gases can be uniformly supplied to the respective wafers 200, and the thickness of the thin films formed on the respective wafers 200 can be made uniform. The residual gas after going through the reaction flows toward an exhaust port, i.e., an exhaust pipe 231 to be described later. However, the flow direction of the residual gas is appropriately specified depending on a position of the exhaust port and is not limited to the vertical direction.

A precursor gas containing a first metal element, for example, titanium tetrachloride ($TiCl_4$), which is a Ti-containing precursor containing at least a titanium (Ti) element, is supplied from the gas supply pipe 310 into the process chamber 201 via the MFC 312, the valve 314, and the nozzle 410. When a liquid precursor such as $TiCl_4$ or the like staying in a liquid state under a room temperature and an atmospheric pressure is used, the liquid precursor is vaporized by a vaporization system such as a vaporizer or a bubbler and is supplied as $TiCl_4$ gas, which is a Ti-containing gas.

A precursor gas containing carbon and a second metal element, for example, TMA (trimethylaluminum: $(CH_3)_3Al$)

containing at least a carbon (C) element and an aluminum (Al) element, is supplied from the gas supply pipe 320 into the process chamber 201 via the MFC 322, the valve 324, and the nozzle 420. When a liquid precursor such as TMA or the like staying in a liquid state is used, the liquid precursor is vaporized by a vaporization system such as a vaporizer or a bubbler and is supplied as a gas containing C and Al.

A precursor gas containing a nitrogen element, for example, ammonia ($NH_3$), is supplied from the gas supply pipe 330 into the process chamber 201 via the MFC 332, the valve 334, and the nozzle 430.

For example, nitrogen ($N_2$) gas is supplied from the carrier gas supply pipes 510, 520, and 530 into the process chamber 201 via the MFCs 512, 522, and 532, the valves 514, 524, and 534, and the nozzles 410, 420, and 430, respectively.

The reaction tube 203 includes an exhaust pipe 231 for exhausting the atmosphere in the process chamber 201. The exhaust pipe 231 is installed at a position opposing the nozzles 410, 420, and 430 in the manifold 209 to penetrate the side wall of the manifold 209. With this configuration, the gases supplied from the gas supply holes 410a, 420a, and 430a to the vicinity of the wafers 200 in the process chamber 201 flow in the horizontal direction, i.e., the direction parallel to the surfaces of the wafers 200, and then flow downward. The gases are exhausted from the exhaust pipe 231.

A pressure sensor 245 as a pressure detector (pressure detection part) for detecting the pressure in the process chamber 201, an APC (Auto Pressure Controller) valve 243, and a vacuum pump 246 as a vacuum exhaust device are installed in the exhaust pipe 231 sequentially from an upstream side. The APC valve 243 is an exhaust valve and functions as a pressure regulator. An exhaust system, i.e., an exhaust line, includes the exhaust pipe 231, the APC valve 243, and the pressure sensor 245. The vacuum pump 246 may be included in the exhaust system.

The APC valve 243 is configured to regulate the pressure in the process chamber 201 by adjusting a valve opening degree while the vacuum pump 246 is in operation.

A temperature sensor 263 as a temperature detector is installed in the reaction tube 203. The amount of power supplied to the heater 207 is adjusted based on the temperature information detected by the temperature sensor 263 so that the inside of the process chamber 201 has a desired temperature distribution. The temperature sensor 263 is formed in an L shape similar to the nozzles 410, 420, and 430, and is installed along the inner wall of the reaction tube 203.

Figure 5:
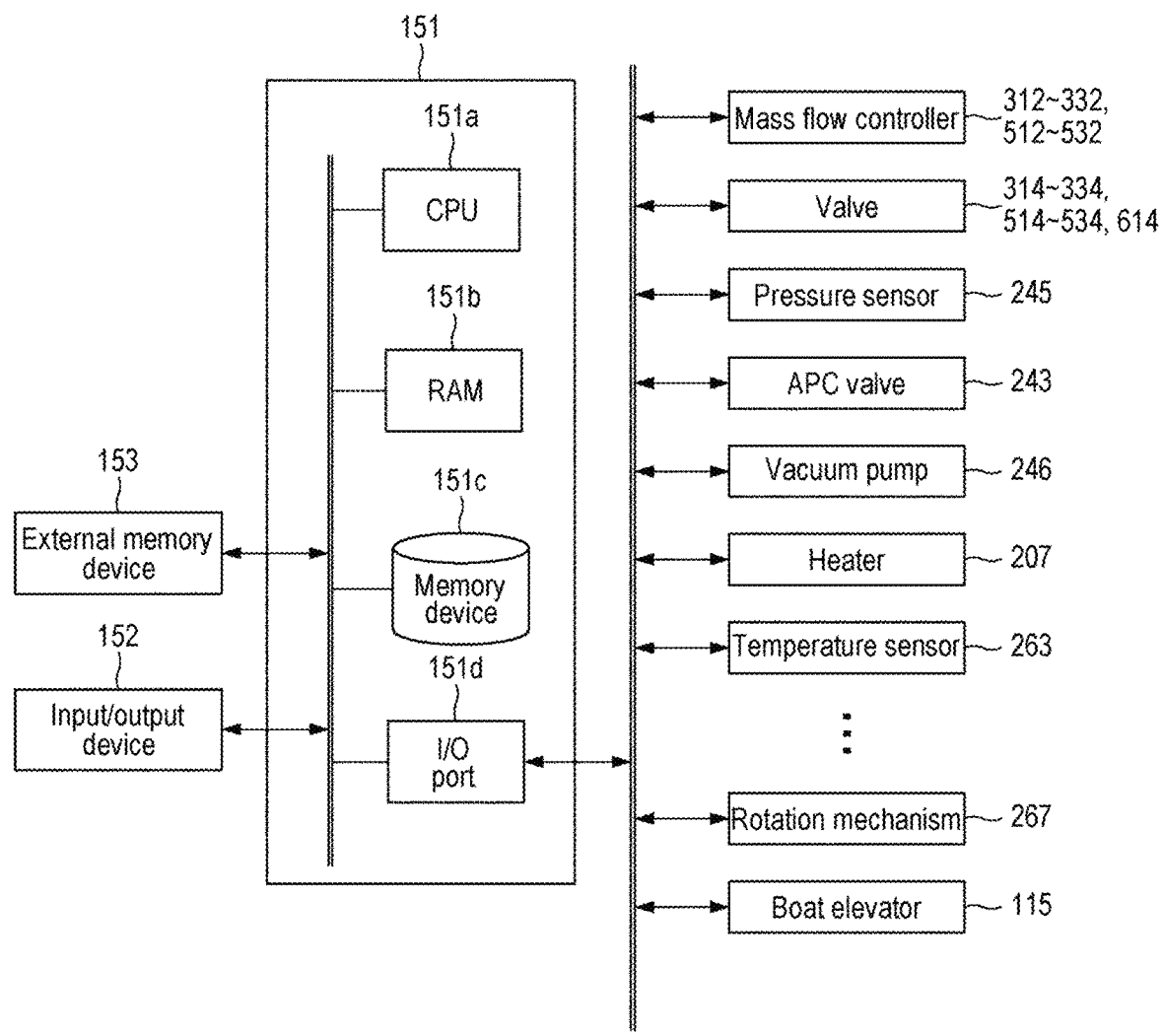
FIG. 5 is an illustrative example of a controller configuration according to the embodiments of the present disclosure.

As illustrated in FIG. 5, the controller 151 as a control part is configured as a computer that includes a CPU (Central Processing Unit) 151a, a RAM (Random Access Memory) 151b, a memory device 151c as a memory part, and an I/O port 151d. The RAM 151b, the memory device 151c, and the I/O port 151d are configured to exchange data with the CPU 151a via an internal bus. An input/output device 152 as an operation part configured as, for example, a touch panel or the like is connected to the controller 151.

The memory device 151c is configured by, for example, a flash memory, an HDD (Hard Disk Drive), or the like. The memory device 151c readably stores a control program for controlling the operations of the substrate processing apparatus, for example, process recipes and the like, in which procedures or conditions of substrate processing are written. Furthermore, the memory device 151c stores a below-described substrate arrangement program according to the present embodiments. The process recipes and the like are combined to cause the controller 151 to execute, for example, each sequence in a substrate processing procedure to be described later so that a predetermined result can be obtained. The process recipes and the like function as a program. Hereinafter, the process recipes, the control program and the like are sometimes collectively and simply referred to as a program. The RAM 151b is configured as a memory area (work area) in which the program read by the CPU 151a, data and the like are temporarily held.

The I/O port 151d is connected to the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotation mechanism 267, the boat elevator 115, and the like.

The CPU 151a is configured to read a control program from the memory device 151c and execute the control program. The CPU 151a is configured to read a process recipe from the memory device 151c in response to an input of an operation command from the input/output device 152, or the like. Furthermore, the CPU 151a is configured to, according to the process recipe thus read, control the operation of adjusting the flow rates of various gases by the MFCs 312, 322, 332, 512, 522 and 532, the operation of opening or closing the valves 314, 324, 334, 514, 524 and 534, the operation of opening or closing the APC valve 243, the operation of regulating the pressure by the APC valve 243 based on the pressure sensor 245, the operation of adjusting the temperature by the heater 207 based on the temperature sensor 263, the operation of starting or stopping the vacuum pump 246, the operation of rotating the boat 217 and adjusting the rotation speed of the boat 217 by the rotation mechanism 267, the operation of raising or lowering the boat 217 by the boat elevator 115, and the like.

The controller 151 is not limited to being configured as a dedicated computer, but may be configured as a general-purpose computer. For example, the controller 151 according to the present embodiments may be configured by installing a program in a general-purpose computer using an external memory device (e.g., a semiconductor memory such as a USB memory, a memory card, or the like) 153 as an external memory part that stores the above-described program.

The means for supplying the program to the computer is not limited to the case where the program is supplied via the external memory device 153. For example, the program may be supplied using a communication means such as the Internet, a dedicated line, or the like without going through the external memory device 153. The memory device 151c and the external memory device 153 are configured as computer-readable recording media. Hereinafter, these are collectively and simply referred to as a recording medium. When the term "recording medium" is used in the subject specification, it may refer to a case of including only the memory device 151c, a case of including only the external memory device 153, or a case of including both the memory device 151c and the external memory device 153.

(2) Substrate Processing Procedure

Next, a metal film-forming process will be described. The metal film-forming process is performed as one of the semiconductor device manufacturing processes using the process furnace 202 of the substrate processing apparatus 100 described above.

Figure 6:
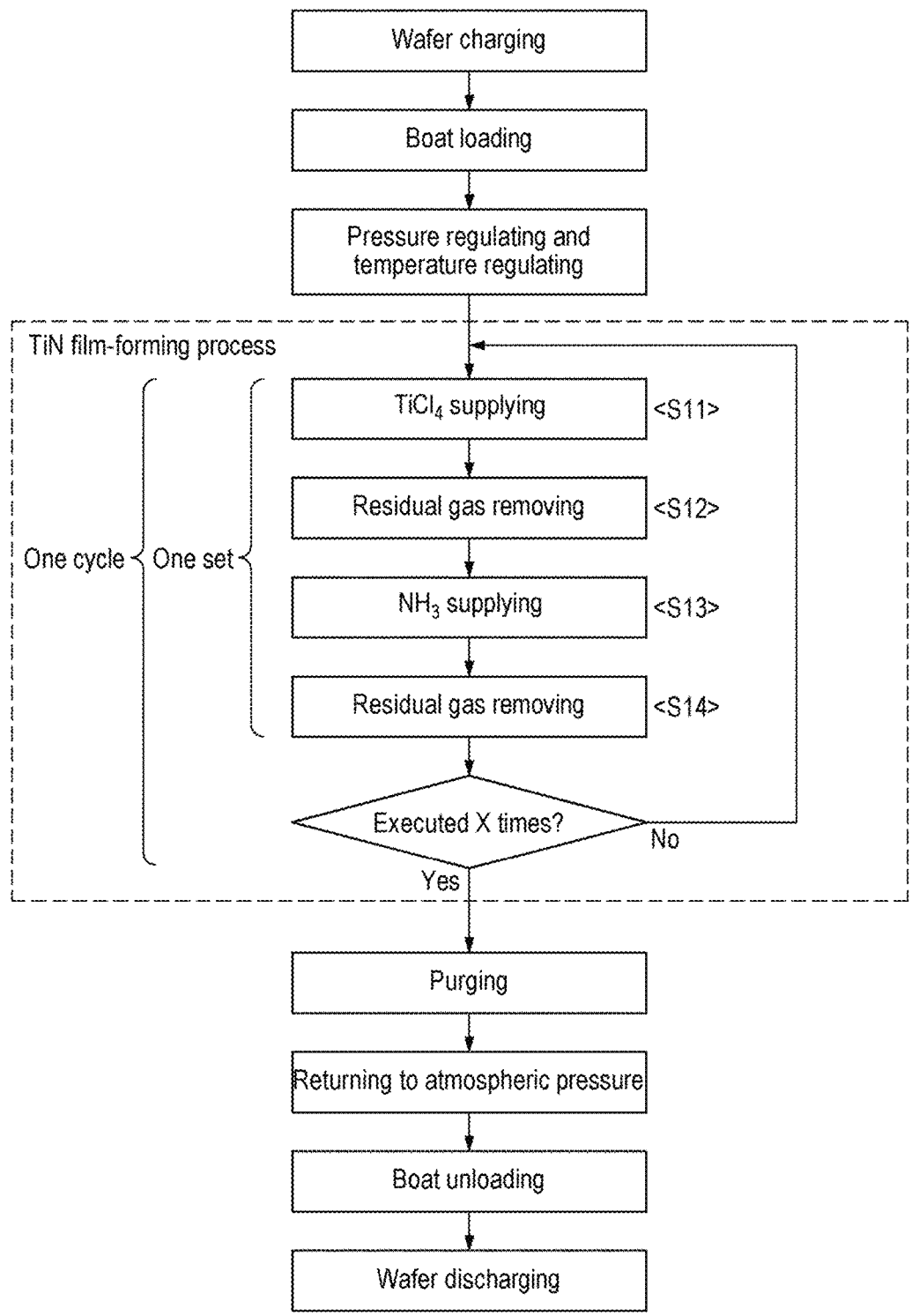
FIG. 6 is a flowchart showing a substrate processing procedure according to the embodiments of the present disclosure.

FIG. 6 is a process flowchart showing an example of a metal film (TiN film, in the present embodiments)-forming process. In the following description, the operation of each part constituting the substrate processing apparatus 100 is controlled by the controller 151.

(Wafer Charging and Boat Loading)

When the plurality of wafers 200 is charged into the boat 217, as shown in FIG. 3, the boat 217 supporting the plurality of wafers 200 is lifted by the boat elevator 115 and loaded into the process chamber 201. In this state, the seal cap 219 closes the lower end opening of the reaction tube 203 via the O-ring 220.

(Pressure Regulating and Temperature Regulating)

The inside of the process chamber 201 is vacuum-exhausted by the vacuum pump 246 to reach a desired pressure (degree of vacuum). In this operation, the pressure in the process chamber 201 is measured by the pressure sensor 245, and the APC valve 243 is feedback-controlled based on the measured pressure information (pressure regulation). Furthermore, the inside of the process chamber 201 is heated by the heater 207 to reach a desired temperature. In this operation, the amount of power supplied to the heater 207 is feedback-controlled based on the temperature information detected by the temperature sensor 263 so that the inside of the process chamber 201 has a desired temperature distribution (temperature adjustment). Subsequently, the rotation of the boat 217 and the wafers 200 by the rotation mechanism 267 is started.

At least until the processing of the wafers 200 is completed, the vacuum pump 246 is kept constantly in operation, and the heating of the inside of the process chamber 201 by the heater 207 and the rotation of the boat 217 and the wafers 200 by the rotation mechanism 267 are continuously performed.

Subsequently, a TiN layer-forming process (S11 to S14) is performed.

($TiCl_4$ Gas Supplying)

The valve 314 of the gas supply pipe 310 is opened, and $TiCl_4$ gas as a first precursor flows into the gas supply pipe 310. The flow rate of the $TiCl_4$ gas flowing through the gas supply pipe 310 is adjusted by the MFC 312. The $TiCl_4$ gas of which flow rate has been adjusted is supplied into the process chamber 201 from the gas supply holes 410a of the nozzle 410 and exhausted from the exhaust pipe 231. In this operation, the $TiCl_4$ gas is supplied to the wafers 200. At the same time, the valve 514 is opened, and an inert gas such as $N_2$ gas or the like flows into the carrier gas supply pipe 510. The flow rate of the $N_2$ gas flowing through the carrier gas supply pipe 510 is adjusted by the MFC 512. The $N_2$ gas of which flow rate has been adjusted is supplied into the process chamber 201 together with the $TiCl_4$ gas, and is exhausted from the exhaust pipe 231. In this operation, in order to prevent the $TiCl_4$ gas from entering the nozzle 420 and the nozzle 430, the valves 524 and 534 are opened, and the $N_2$ gas flows into the carrier gas supply pipe 520 and the carrier gas supply pipe 530. The $N_2$ gas is supplied into the process chamber 201 through the gas supply pipe 320, the gas supply pipe 330, the nozzle 420, and the nozzle 430, and is exhausted from the exhaust pipe 231.

In this operation, the APC valve 243 is appropriately adjusted to set the pressure in the process chamber 201 to a pressure within a range of, for example, 0.1 to 6,650 Pa. The supply flow rate of the $TiCl_4$ gas controlled by the MFC 312 is set to a flow rate in a range of, for example, 100 to 2,000 sccm. The supply flow rate of the $N_2$ gas controlled by the MFCs 512, 522 and 532 is set to a flow rate within a range of, for example, 100 to 30,000 sccm. The time for supplying the $TiCl_4$ gas to the wafers 200, i.e., the gas supply time (irradiation time) is set to a time within a range of, for example, 0.01 to 20 seconds. In this operation, the temperature of the heater 207 is set to such a temperature that the temperature of the wafers 200 falls within a range of, for example, 250 to 550 degrees C. By supplying the $TiCl_4$ gas, a Ti-containing layer of, for example, less than one atomic layer is formed on the wafer 200.

(Residual Gas Removing)

After the Ti-containing layer is formed, the valve 314 of the gas supply pipe 310 is closed, and the supply of the $TiCl_4$ gas is stopped. In this operation, while the APC valve 243 of the exhaust pipe 231 is kept opened, the inside of the process chamber 201 is vacuum-exhausted by the vacuum pump 246, and the $TiCl_4$ gas that has not reacted or that has contributed to the formation of the Ti-containing layer, which remains in the process chamber 201, is removed from the process chamber 201. In this operation, the valves 514, 524, and 534 are kept opened, and the supply of the $N_2$ gas into the process chamber 201 is maintained. The $N_2$ gas acts as a purge gas, thereby enhancing the effect of removing from the process chamber 201 the $TiCl_4$ gas that has reacted or that has contributed to the formation of the Ti-containing layer, which remains in the process chamber 201.

($NH_3$ Gas Supplying)

After removing the residual gas remaining in the process chamber 201, the valve 334 of the gas supply pipe 330 is opened, and $NH_3$ gas flows into the gas supply pipe 330. The flow rate of the $NH_3$ gas flowing through the gas supply pipe 330 is adjusted by the MFC 332. The $NH_3$ gas of which flow rate has been adjusted is supplied into the process chamber 201 from the gas supply holes 430a of the nozzle 430. After the $NH_3$ gas supplied into the process chamber 201 is activated by heat, the $NH_3$ gas is exhausted from the exhaust pipe 231. In this operation, the $NH_3$ gas activated by heat is supplied to the wafers 200. At the same time, the valve 534 is opened, and $N_2$ gas flows into the carrier gas supply pipe 530. The flow rate of the $N_2$ gas flowing through the carrier gas supply pipe 530 is adjusted by the MFC 532. The $N_2$ gas is supplied into the process chamber 201 together with the $NH_3$ gas and is exhausted from the exhaust pipe 231. In this operation, in order to prevent the $NH_3$ gas from entering the nozzles 410 and 420, the valves 514 and 524 are opened, and the $N_2$ gas flows into the carrier gas supply pipes 510 and 520. The $N_2$ gas is supplied into the process chamber 201 through the gas supply pipes 310 and 320 and the nozzles 410 and 420, and is exhausted from the exhaust pipe 231.

When the $NH_3$ gas is activated by heat and allowed to flow, the APC valve 243 is appropriately adjusted to set the pressure in the process chamber 201 to a pressure within a range of, for example, 0.1 to 6,650 Pa. The supply flow rate of the $NH_3$ gas controlled by the MFC 332 is set to a flow rate within a range of, for example, 100 to 20,000 sccm. The supply flow rate of the $N_2$ gas controlled by the MFCs 512, 522, and 532 is set to a flow rate within a range of, for example, 100 to 30,000 sccm. The time for supplying the thermally activated $NH_3$ gas to the wafers 200, i.e., the gas supply time (irradiation time), is set to a time within a range of, for example, 0.01 to 30 seconds. In this operation, as in S11, the temperature of the heater 207 is set to such a temperature that the temperature of the wafers 200 falls within a range of, for example, 250 to 500 degrees C.

In this operation, the gas flowing into the process chamber 201 is the $NH_3$ gas which is thermally activated by increasing the pressure in the process chamber 201. The activated $NH_3$ gas reacts with at least a part of the Ti-containing layer formed on the wafer 200 in S11. Thus, the Ti-containing layer is nitrided and modified into a titanium nitride layer (TiN layer).

(Residual Gas Removing)

After the TiN layer is formed, the valve 334 of the gas supply pipe 330 is closed to stop the supply of the $NH_3$ gas. In this operation, while the APC valve 243 of the exhaust pipe 231 is kept opened, the inside of the process chamber 201 is vacuum-exhausted by the vacuum pump 246, and the $NH_3$ gas that has not reacted or that has contributed to the formation of the TiN layer, or the reaction byproduct, which remains in the process chamber 201, is removed from the process chamber 201. In this operation, the valves 514, 524, and 534 are kept opened, and the supply of the $N_2$ gas into the process chamber 201 is maintained. The $N_2$ gas acts as a purge gas, thereby enhancing the effect of removing the $NH_3$ gas that has not reacted or that has contributed to the formation of the TiN layer, or the reaction byproduct, which remains in the process chamber 201, from the process chamber 201.

The process from S11 to S14 is executed X times set in advance (first predetermined number of times). That is, the process from S11 to S14 is defined as one set, and is executed by X sets. By alternately performing the supply of the $TiCl_4$ gas and the supply of the $NH_3$ gas X times in this manner, a TiN layer (first layer) having a predetermined thickness is formed.

(Purging and Returning to Atmospheric Pressure)

After the film-forming process for forming the TiN film having a predetermined thickness is performed, an inert gas such as $N_2$ gas or the like is supplied into the process chamber 201 and exhausted from the exhaust pipe 231, whereby the inside of the process chamber 201 is purged with the inert gas (gas purging). Thereafter, the atmosphere in the process chamber 201 is substituted with the inert gas (inert gas substitution), and the pressure in the process chamber 201 is returned to an atmospheric pressure (returning to atmospheric pressure).

(Boat Unloading and Wafer Discharging)

Thereafter, the seal cap 219 is lowered by the boat elevator 115 to open the lower end of the reaction tube 203, and the processed wafers 200 supported on the boat 217 are unloaded from the lower end of reaction tube 203 to the outside of the reaction tube 203. Thereafter, the processed wafers 200 are discharged from the boat 217.

Next, a substrate processing sequence in the present embodiments will be described with reference to FIG. 7. In the present embodiments, it is configured to execute up to the substrate processing procedure (process recipe). For example, the process up to the substrate transfer to the boat 217 may be executed.

(S1) At least a predetermined number of product substrates 200 are put into the substrate processing apparatus 100. When the controller 151 receives an instruction to process the product substrates 200 from the host computer or the input/output device 152, the substrate processing sequence according to the present embodiments is started.

(S2) The controller 151 acquires various data for arranging (laying out) the substrates on the boat 217 from the memory device 151c. Specifically, the controller 151 acquires information including a number of all the slots of the boat and numbers of the plurality of types of substrates such as product substrates, monitor wafers, and supplementary dummy wafers. In addition, the controller 151 may be configured to appropriately display a setting screen on the input/output device 152 in order to obtain data necessary for creating substrate arrangement data from an operator.

(S3) The controller 151 is configured to create substrate arrangement data by executing the substrate arrangement program shown in FIG. 8, which will be described later, based on the acquired data. The controller 151 is configured to store the created substrate arrangement data in the memory device 151c. Specifically, the substrate arrangement data is stored in association with a process recipe for processing the product substrates 200. Details of the substrate arrangement program will be described later.

(S4) The controller 151 operates the transfer mechanism such as the wafer transfer mechanism 125 or the like based on the substrate arrangement data created in S3, thereby transferring the plurality of types of substrates to the boat 217.

(S5) This operation executes a process recipe previously stored in the memory device 151c or a process recipe associated with a substrate arrangement program to be described later. The controller 151 executes the process recipe as described above, thereby performing a predetermined process to the product substrates 200. In the present embodiments, a metal film (TiN film) is formed.

Next, the substrate arrangement program according to the present embodiments will be described with reference to FIG. 8. Referring to FIG. 8, the controller 151 is configured to create substrate arrangement data for distributing and mounting product substrates on a plurality of substrate mounting regions of the boat 217, by dividing the product substrates into a plurality of product substrate groups (hereinafter also, referred to as first units) based on a number of substrates mountable on the boat 217 (hereinafter, also referred to as a number of product region slots) and a number of product substrates to be mounted on the boat 217, dividing dummy substrates into a plurality of dummy substrate groups (hereinafter, also referred to as third units) based on the acquired number of product substrates, the number of substrates mountable on the boat 217, and a number of product substrate groups (first units), and combining the product substrate groups (first units) and the dummy substrate groups (third units).

Figure 7:
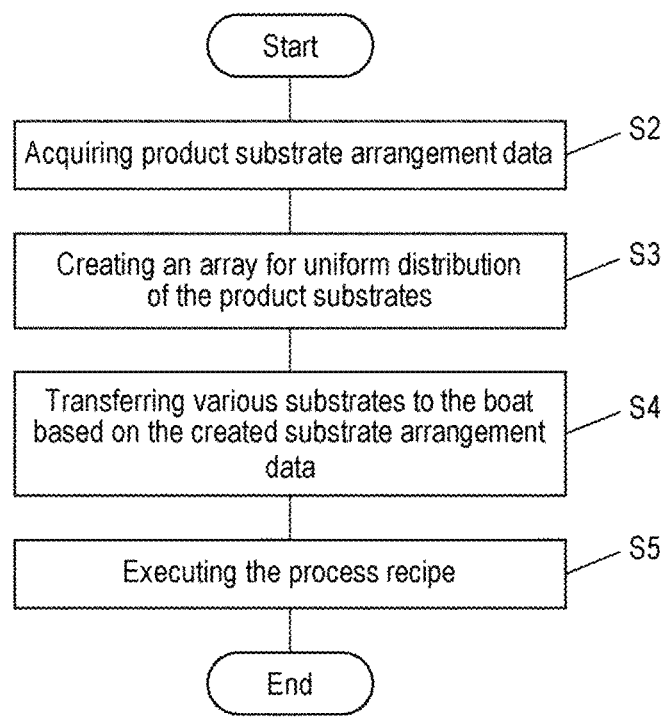
FIG. 7 is a flowchart showing a substrate processing sequence according to the embodiments of the present disclosure.

(S101) The controller 151 confirms execution conditions for substrate arrangement based on the various data acquired in S2 of FIG. 7.

(S102) The controller 151 divides the inputted product substrates 200 into sets of N substrates (N is a natural number). In this regard, a group of substrates, which is divided into a set of N substrates, is referred to as a unit, and a group of such units (an aggregate of units) is referred to as an array. A number of all the divided units is calculated, and an array of the product substrates 200 is created. In some embodiments, a default of N is set to 5. This is set to a maximum value at which the substrates can be transferred at one time in conformity with the number of tweezers 125c of the transfer mechanism 125. Thus, it possible to reduce a transfer time.

When the number of inputted product substrates 200 cannot be divided by N, the product substrates 200 are divided into product substrate groups divided into N substrates and product substrate groups divided into N–1 substrates. The product substrate groups divided into N substrates are referred to as large units, and the product substrate groups divided into N–1 substrates are referred to as small units. In the following description, the same also applies to monitor wafers.

The controller 151 is configured to calculate a total number of units of the product substrates 200, a number of large units, and a number of substrates in the large units, respectively, based on the execution conditions confirmed in S101. Furthermore, the controller 151 is configured to rearrange the array of the product substrates 200 according to priority position correction information of the large units.

(S103) The controller 151 is configured to create an array of the product substrates 200 and the monitor wafers by confirming a number of monitor wafer units, determining the positions of the monitor wafer units, and combining the monitor wafer units with the array (first array) of the product substrates 200 created in S102, based on the execution conditions confirmed in S101. Hereinafter, the monitor wafer units are referred to as second units.

If there is no designation of transfer of the monitor wafers, the process proceeds to the next operation (S104) without performing operation S103. The arrangement determination of the second units will be described later with reference to FIGS. 9A and 9B.

(S104) The controller 151 creates an array of the supplementary dummy substrates 200. The controller 151 is configured to create an array by calculating a number of dummy substrates and a number of large intervals (to be described later), and to rearrange the array according to the priority position correction information of the large intervals. In this regard, the supplementary dummy substrate units are referred to as third units. Then, the controller 151 creates an array of substrate arrangement data by interrupting the third units, which include the supplementary dummy substrates, between the first units, and between the first unit and the second unit.

(S105) If there is a designation to transfer the second units to between the upper and lower side dummy substrates and the outside of the array (third array) created in S104, the controller 151 finishes the creation of the array of substrate arrangement data by combining the second units, according to the execution conditions confirmed in S101.

FIG. 9B shows setting examples in which the monitor wafers are transferred in cases from no monitor wafer (leftmost) to transfer pattern 7 (rightmost), when the number of product region slots is 100 and the number of product substrates PD arranged in the mounting region for the product substrates 200 is 50 (N=5, the number of first units is 10, and the number of product substrates in every unit is 5). FIG. 9A is a view schematically showing a transfer situation when an array of substrate arrangement data is created by executing the substrate arrangement program according to the present embodiments for each of the setting examples and the plurality of types of substrates are mounted on the boat 217 using the substrate arrangement data. SD indicates side dummy substrates, FD indicates supplementary dummy substrates, M indicates monitor wafers, and SD5 indicates that five side dummy substrates are transferred. The number of product region slots refers to the number of slots for mounting the plurality of types of substrates except for the slots for mounting the upper and lower side dummy substrates.

FIG. 9B illustrates a table, which is surrounded by a dotted line, which shows setting a transfer pattern for transferring the monitor wafers. The setting table includes an item for setting whether or not to transfer the monitor wafers near the upper and lower side dummy substrates (indicated as "upper" and "lower" in FIG. 9B). The setting table is prepared such that the monitor wafers can be arranged at one to four locations in the region for mounting the product substrates 200 sandwiched between the upper and lower side dummy substrates. The number of monitor wafers can be set for each location.

In FIG. 9B, the middle (1) is set when the monitor wafer is mounted in a region (the central portion of the boat 217) such that the mounting region of the product substrates 200 is divided into two equal regions. In this case, it is shown that the monitor wafer is transferred to one location (first location) in the mounting region of the product substrates 200 (see transfer pattern 2 and transfer pattern 4 in FIGS. 9A and 9B). The middle (2) is set when the monitor wafer is mounted in a region such that the mounting region of the product substrates 200 is divided into three equal regions. It is shown that the monitor wafer is transferred to the second location from above of the two locations in the mounting region of the product substrates 200 (see transfer pattern 5 in FIGS. 9A and 9B).

The middle (3) is set when the monitor wafer is mounted in a region such that the mounting region of the product substrates 200 is divided into four equal regions. In this case, it is shown that the monitor wafer is transferred to the third location from above among three locations in the mounting region of the product substrates 200 (see transfer pattern 6 in FIGS. 9A and 9B). The middle (4) is set when the monitor wafer is mounted in a region such that the mounting region of the product substrates 200 is divided into five equal regions. In this case, it is shown that the monitor wafer is transferred to the fourth location from above among four locations in the mounting region of the product substrates 200 (see transfer pattern 7 in FIGS. 9A and 9B).

The number of regions of the monitor wafers transferred to the middle of the product region is counted with an effective number of regions designated with one or more wafers. That is, the controller 151 is configured to divide the first unit array (the array of the product substrates) by the number of the designated regions with one or more wafers. Therefore, if an operator sets the middle (1)=0, the middle (2)=0, and the middle (3)=1, the controller 151 interprets the necessary region to be the same as the middle (1)=1, which is the case in which the middle (1)=0, the middle (2)=0, the middle (3)=1, and the middle (4)=0, and arranges the monitor wafers to divide the first unit array into two equal unit arrays (similar to transfer pattern 2 in FIGS. 9A and 9B). In addition, when the middle (1)=0, the middle (2)=2, the middle (3)=0, and the middle (4)=1, the controller 151 interprets the necessary regions to be the same as the middle (1)=2 and the middle (2)=1, and arranges the monitor wafer so as to divide the first unit array into three equal unit arrays (see transfer pattern 5 in FIGS. 9A and 9B).

In the transfer pattern 6 (the second from the right) shown in FIGS. 9A and 9B, 4 is set for each of the upper, the middle (1), the middle (2), the middle (3), and the lower. Therefore, four monitor wafers are transferred to each of the regions (three locations) that divide the mounting region of the upper and lower side dummy substrates and the product substrates 200 into four equal regions.

As described above, when the transfer pattern of the monitor wafer is previously set in the setting table shown in FIG. 9B, the monitor wafer can be transferred to a desired region by executing the substrate arrangement program according to the present embodiments.

As shown in FIG. 9A, the dummy substrate unit (third unit) is arranged between the product substrate units (first units) or the monitor wafer regions (second units). The first units are configured not to be adjacent to the second units.

Specific examples of the substrate arrangement program shown in FIG. 8 will be described with reference to FIG. 10. When the controller 151 executes the substrate arrangement program, operations such as S102 and the like in FIG. 10 correspond to the operations shown in FIG. 8 and indicate a procedure in which the controller 151 creates an array of the substrates 200. In this regard, the product wafer is referred to as PD, the supplementary dummy substrate is referred to as FD, and the monitor wafer is referred to as M.

Figure 10:
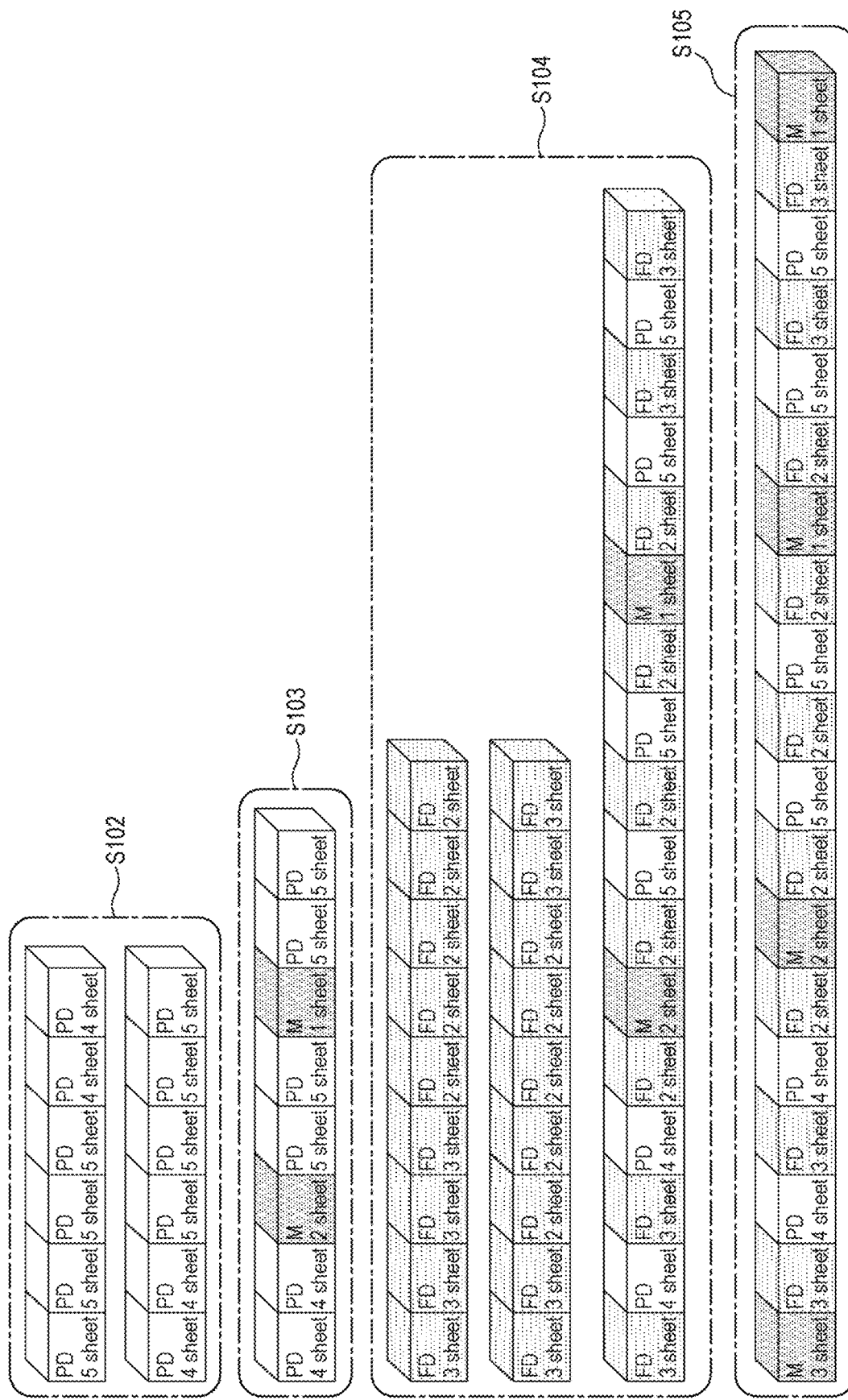
FIG. 10 is a view showing specific examples of the substrate arrangement program according to the embodiments of the present disclosure.

FIG. 10 shows a procedure for creating a substrate array by the controller 151 when the product substrates PD=28, the number of the product region slots=57, and the setting of the monitor transfer pattern table as illustrated in FIG. 9B is the upper=3, the middle (1)=2, the middle (2)=1, and the lower=1. In addition, for the product substrates, designation is made such that the large unit is preferentially arranged on the lower side. For the dummy substrates, designation is made such that the large interval (to be described later) is preferentially arranged at both ends. These pieces of information for creating the substrate arrangement are confirmed in S101 shown in FIG. 8.

(S102) Since there are 28 product substrates PD, six units (array) of 5, 5, 5, 5, 4, and 4 as the units of the product substrates PD are created. In this regard, the first unit (large) is 5 and the first unit (small) is 4. Then, if necessary, rearrangement is performed according to the priority arrangement information of the product substrates PD, and the operation of S102 is terminated. In this case, the rearrangement is performed such that the first unit (small) is arranged on the upper side of the boat 217 and the first unit (large) is arranged on the lower side of the boat 217. As a result, the first array creation operation is completed, and the process proceeds to the next operation.

(S103) Since the setting of the transfer pattern shown in FIG. 9B is such that the middle (1)=2 and the middle (2)=1, the monitor wafers M are arranged to divide the array of the product substrates PD (six units) into three equal sizes. Accordingly, the controller 151 is configured to create an array so that the first unit (small) of 4, the first unit (small) of 4, the second unit of 2, the first unit (large) of 5, the first unit (large) of 5, the second unit of 1, the first unit (large) of 5, and the first unit (large) of 5 are arranged from the upper side of the boat 217. Thus, the second array creation operation is completed, and the process proceeds to the next operation.

(S104) The controller 151 is configured to create an array of the supplementary dummy substrates FD. That is, the controller 151 calculates the allocation of a number of remaining slots in the boat 217 obtained by subtracting the product substrates PD+the monitor wafers M from the product substrate region slots. For example, the calculated number of slots in the boat 217 is divided by the number of first units+the number of second units+1, to thereby divide the remaining slots. If the number of remaining slots cannot be divided, the interval (number of slots) is determined by a combination of the number of slots, i.e., S, and the other number of slots, i.e., S−1. The number of slots S is defined as a large interval, and the number of slots S−1 is defined as a small interval.

In FIG. 10, the number of product region slots−the number of product substrates PD−the number of monitor wafers=22, and the number of first units+second units is 8. Therefore, the controller 151 calculates the number of slots S=3, the number of slots S−1 =2, the number of units having S slots=4 units, and the number of units having S−1 slots=5 units so that the total number of the units having slots becomes 9.

In this regard, if the large interval is referred to as a number of slots (large) and the small interval is referred to as a number of slots (small), an array (third unit) of the supplementary dummy substrates FD indicating that the fill dummy substrates FD are supplemented to the number of slots (large) and the number of slots (small) is created. If necessary, the array can be rearranged according to the priority arrangement information of the supplementary dummy substrates FD. In this case, the array of the supplementary dummy substrates FD is rearranged so that the number of slots (large) is arranged at both ends of the boat 217.

The controller 151 is configured to combine the created array of the supplementary dummy substrates FD (third unit) with the second array (the array of the product substrates PD and the monitor wafers M) created in S103. The third unit is arranged between the units (first units) of the product substrates PD or between the unit of the product substrate PD (first unit) and the unit of the monitor wafers M (second unit). That is, the third unit is arranged so that the first units or the first unit and the second unit are not adjacent to each other.

Thus, the third array creation operation is completed, and the process proceeds to the next operation.

(S105) If the setting of the transfer pattern of the monitor wafers M is designated in advance, the monitor wafers M are arranged between the side dummy substrate SD and the third unit arranged outside of the third array.

In this case, according to the setting of the upper=3 and the lower=1, the controller 151 arranges the unit of monitor wafers M (3 monitor wafers) between the upper side dummy substrate and the third unit arranged at the upper end, and arranges the unit of the monitor wafers M (1 monitor wafer) between the lower side dummy substrate and the third unit arranged on the lower side so that they are mounted on the boat 217. Then, the creation of the substrate arrangement data is completed.

Embodiment Example 1

Figure 8:
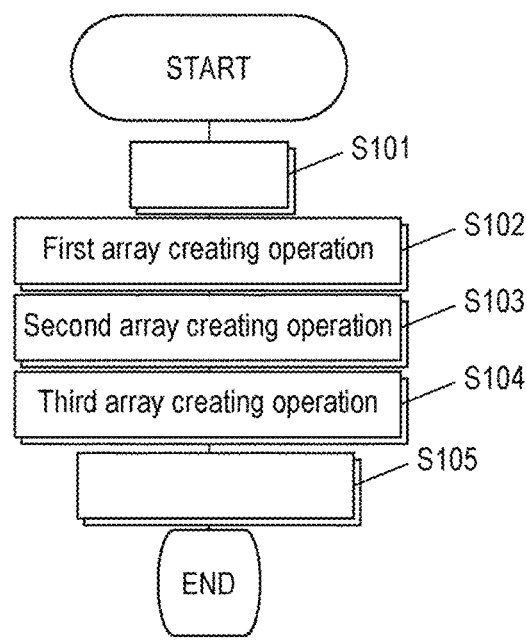
FIG. 8 is a flowchart showing a substrate arrangement program according to the embodiments of the present disclosure.
Figure 11:
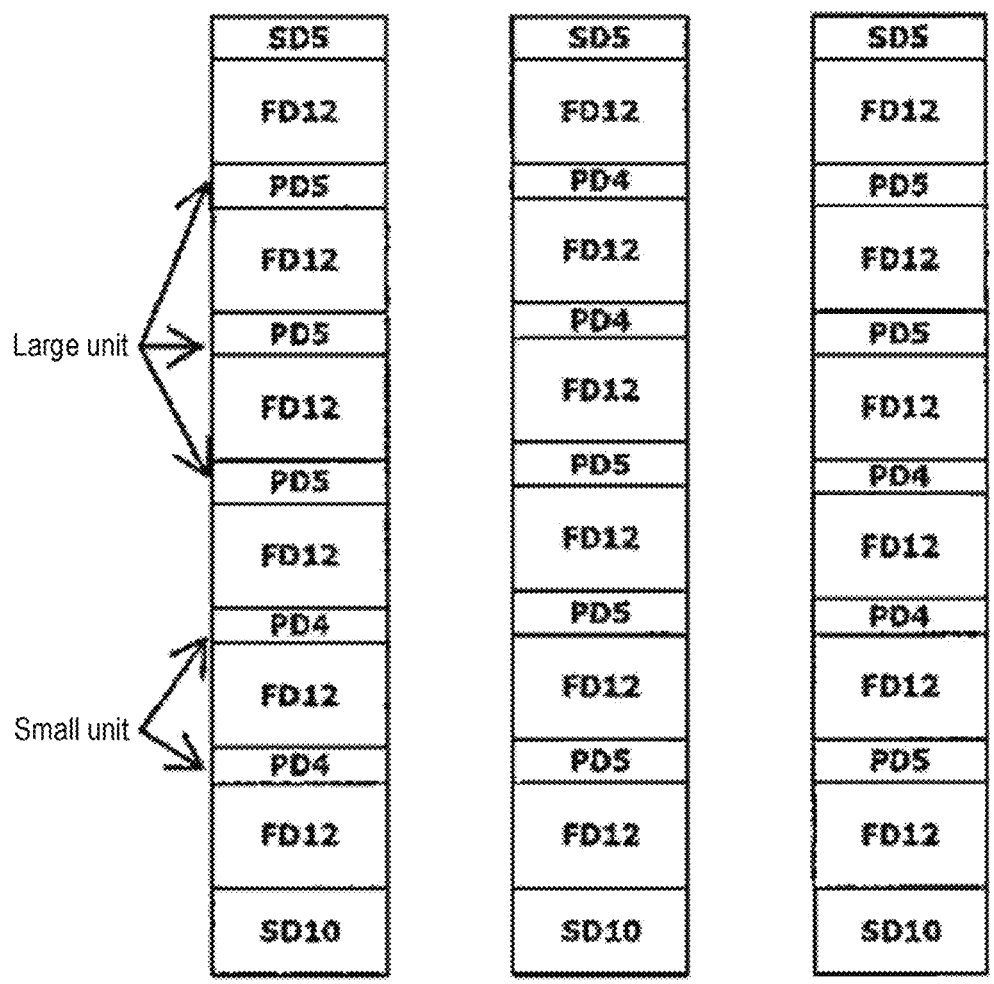
FIG. 11 is a view showing embodiment examples of the substrate arrangement program according to the embodiments of the present disclosure.

FIG. 11 schematically shows, as one example, a state in which the substrate arrangement program shown in FIG. 8 is executed under a condition that the number of product region slots is 95, the number of product substrates PD is 23, and the monitor wafer M shown in FIG. 9B is not designated, and such the plurality of types of substrates are transferred to the boat 217. FIG. 11 shows cases where the units of the product substrates PD cannot be divided by the default (N=5), i.e., cases where the product substrates PD are a combination of the large unit and the small unit. The priority arrangements of the large unit shown in FIG. 11 indicate the upper side, the lower side and both ends, respectively.

Embodiment Example 2

FIG. 12 schematically shows, as one example, a state in which the substrate arrangement program shown in FIG. 8 is executed under a condition that the number of product region slots is 83, the number of product substrates PD is 20 and the monitor wafer M shown in FIG. 9B is not designated, and such the plurality of types of substrates are transferred to the boat 217. FIG. 12 shows cases where the remaining slots of the boat 217 (the difference between the number of product region slots and the number of product substrates PD) cannot be divided, i.e., cases where both the number of slots (large) and the number of slots (small) exist. The priority arrangement of the number of slots (large) shown in FIG. 12 indicates the upper side, the lower side and both ends, respectively.

As described above, according to the present embodiments (Embodiment Example 1 or Embodiment Example 2), when the number of product substrates PD is smaller than the number of product region slots, the product substrates PD can be divisionally arranged in a plurality of regions in the substrate processing region of the boat 217.

Furthermore, according to the present embodiments (Embodiment Example 1 or Embodiment Example 2), the number of product substrates PD is set to be the same as the number of tweezers 125c of the transfer mechanism 125. This makes it possible to reduce the time for transferring the product substrates PD with respect to the number of product region slots.

In the present embodiments (Embodiment Example 1 or Embodiment Example 2), the effect becomes remarkable if the number of product substrates PD is 20 or more with respect to the number of product region slots. This is because if the number of product substrates PD is too small (for example, 10 or less), the transfer time is not so different from the time required in a case where the product substrates PD are transferred one by one. In addition, the number of product substrates PD may be 100 or less or 80 or less. This is because if the number of product substrates PD is large, it is not necessary to dispersedly arrange the product substrates 200 for each unit in the present embodiments.

FIG. 13 shows the results obtained by transferring each of the product substrates 200 according to the present embodiments and the product substrates 200 according to a comparative example to the boat 217 and measuring the film thickness under the same conditions. Only the product substrates (or the product substrate group) 200 are shown in the figure for the sake of easy understanding. The uniformity of the film thickness uniformity of the product substrates 200 in the present embodiments is 0.15, whereas that of the comparative example is 0.57. The measurement result shows that the product substrates 200 according to the present embodiments are better than the comparative example.

As described above, according to the present embodiments, a plurality of product substrates can be dispersedly arranged on (transferred to) the boat according to the number of inputted product substrates and the number of slots in the boat. Therefore, it is possible to improve the film thickness uniformity between product substrates in the furnace and to suppress a decrease in substrate quality.

In particular, according to the present embodiments, the effect becomes more remarkable when the product substrates are pattern wafers. As compared with normal wafers having no pattern, the pattern wafers have a larger surface area. Therefore, the gas consumption around the pattern wafers (group) (the amount of contribution to film formation reaction) increases, and the film deposition rate decreases due to the lowered gas partial pressure. In addition, the amount of reaction by-products generated around the pattern wafers (group) increases, and the reaction by-products re-adhere to the wafer surface, thereby inhibiting film formation and causing a decrease in film deposition rate. In this regard, the pattern wafer refers to a wafer obtained by forming a complex fine pattern on the surface of a normal wafer.

According to the present embodiments, the substrates can be dispersedly arranged on (transferred to) the boat for each number of substrates which can be collectively transferred by the transfer mechanism. Therefore, it is possible to reduce the substrate transfer time and to improve the production efficiency.

According to the present embodiments, it is not necessary for an apparatus operator to select the substrate arrangement parameters according to the number of product substrates to be inputted, the presence/absence of the monitor wafer, and the arrangement position of the monitor wafer, and it is possible to automatically determine the substrate arrangement without the intervention of the apparatus operator. Therefore, it is possible to reduce man-hours and mistakes of the apparatus operator.

In the above-described embodiments, there has been described examples in which the thin film is formed using the substrate processing apparatus including a hot-wall type process furnace. However, the present disclosure is not limited thereto, and may be suitably applied to cases where a thin film is formed using a substrate processing apparatus including a cold-wall type process furnace.

Furthermore, the present disclosure is not limited to a semiconductor manufacturing apparatus for processing a semiconductor wafer such as the substrate processing apparatus according to the present embodiments, but may also be applied to an LCD (Liquid Crystal Display) manufacturing apparatus for processing a glass substrate.

The present disclosure may be applied to a substrate processing apparatus that accommodates a boat holding a plurality of substrates in a process furnace, supplies a process gas, heats the process gas, and processes the substrates.

According to the present disclosure in some embodiments, by appropriately arranging the substrates on the boat, it is possible to improve the uniformity of the film thickness of the product substrates in the furnace and to suppress the reduction of the substrate quality.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a substrate holder configured to hold a plurality of substrates including product substrates, which are homogeneous, and dummy substrates;
   a transfer mechanism configured to transfer the product substrates and the dummy substrates to the substrate holder; and
   a controller configured to be capable of:
   acquiring a number of substrates mountable on the substrate holder and a number of the product substrates to be mounted on the substrate holder;
   dividing the product substrates into a plurality of product substrate groups based on the acquired number of the product substrates;
   calculating a number of the dummy substrates based on the acquired number of the product substrates and the acquired number of the substrates mountable on the substrate holder;
   dividing the dummy substrates into a plurality of dummy substrate groups based on the number of the dummy substrates and a number of the product substrate groups;
   creating substrate arrangement data for arranging the dummy substrate groups between the product substrate groups; and
   causing the transfer mechanism to transfer the product substrates and the dummy substrates to the substrate holder according to the created substrate arrangement data.

2. The substrate processing apparatus of claim 1, wherein the transfer mechanism is configured to be capable of collectively transferring N substrates of the plurality of substrates, where N is a positive integer, and wherein the controller is configured to:
divide the product substrates into the plurality of product substrate groups of N product substrates and N−1 product substrates according to the acquired number of the product substrates; and
create the substrate arrangement data such that the divided product substrate groups are transferred to a plurality of regions of the substrate holder.

3. The substrate processing apparatus of claim 1, wherein the controller is configured to:
combine the product substrate groups and the dummy substrate groups; and
create the substrate arrangement data for distributing and mounting the product substrates on a plurality of regions of the substrate holder.

4. The substrate processing apparatus of claim 1, wherein the controller is configured to create a number of the dummy substrate groups to be larger than the number of the product substrate groups.

5. The substrate processing apparatus of claim 1, wherein the controller is configured to arrange the dummy substrate groups outside substrate groups that are arranged at both ends of the product substrate groups.

6. The substrate processing apparatus of claim 1, wherein the number of the product substrates is 20 or more and 100 or less.

7. The substrate processing apparatus of claim 1, wherein each of the product substrate groups includes five or less of the product substrates.

8. The substrate processing apparatus of claim 1, wherein the controller includes a setting screen for setting a transfer pattern by which monitor substrates are transferred to the substrate holder, and is configured to set, on the setting screen, a number of a part of the monitor substrates to be transferred to upper and lower ends of the substrate holder and a number of a part of the monitor substrates to be transferred to a substrate holding region of the substrate holder.

9. A non-transitory computer-readable recording medium storing a program executed by a substrate processing apparatus comprising:
a substrate holder configured to hold a plurality of substrates including product substrates, which are homogeneous, and dummy substrates;
a transfer mechanism configured to transfer the product substrates and the dummy substrates to the substrate holder; and
a controller configured to be capable of controlling the transfer mechanism to transfer the product substrates and the dummy substrates to the substrate holder;
wherein the program causes the controller to be capable of performing:
acquiring a number of substrates mountable on the substrate holder and a number of the product substrates to be mounted on the substrate holder;
dividing the product substrates into a plurality of product substrate groups based on the acquired number of the product substrates;
calculating a number of the dummy substrates based on the acquired number of the product substrates and the acquired number of the substrates mountable on the substrate holder;
dividing the dummy substrates into a plurality of dummy substrate groups based on the number of the dummy substrates and a number of the product substrate groups;
creating substrate arrangement data for arranging the dummy substrate groups between the product substrate groups; and
causing the transfer mechanism to transfer the product substrates and the dummy substrates to the substrate holder according to the created substrate arrangement data.

* * * * *